United States Patent [19]

Entwistle

[11] 4,003,058
[45] Jan. 11, 1977

[54] COLOR IMAGE DATA RECORDER

[75] Inventor: Geoffrey S. Entwistle, Severna Park, Md.

[73] Assignee: TRW Inc., Redondo Beach, Calif.

[22] Filed: Aug. 27, 1974

[21] Appl. No.: 500,990

[52] U.S. Cl. .................................. 346/1; 346/46; 346/110 R; 358/5; 358/130
[51] Int. Cl.$^2$ .................................. G01D 15/14
[58] Field of Search .................. 346/1, 46, 110 R; 358/4, 5, 6, 7; 178/6.7 R, 6.7 A

[56] References Cited

UNITED STATES PATENTS

| | | | |
|---|---|---|---|
| 2,422,778 | 6/1947 | Finch | 358/75 |
| 2,944,620 | 7/1960 | VanDnck | 346/46 X |
| 3,243,820 | 3/1966 | Alexander | 346/46 X |
| 3,665,420 | 5/1972 | Somervell | 346/110 R X |
| 3,783,185 | 1/1974 | Spaulding | 358/8 |

Primary Examiner—Joseph W. Hartary
Attorney, Agent, or Firm—Stephen J. Koundakjian; Edwin A. Oser

[57] ABSTRACT

Disclosed is an apparatus for producing color hardcopy pictorial data recordings.

A two-dimensional data frame is displayed on a black-and-white CRT screen and is ultimately recorded on a moving photographic film as a color line, which line is parallel to the horizontal dimension of the CRT screen. The vertical position and intensity of any illuminated phosphor dot in a given horizontal position on the screen determine, respectively, the hue and the intensity of the resolution element in the color line having the same relative horizontal position. The light from the CRT screen is collimated, spectrally dispersed and imaged onto an image plane containing the slit. The elements of the apparatus, including the slit, are relatively positioned so that a particular vertical position on the CRT screen will cause light of a particular color to be imaged onto the slit. As successive data frames are sequentially displayed on the CRT screen, the photographic film is moved behind the slit, so that successive data frames are recorded on the film as a closely-spaced succession of corresponding colored horizontal lines, thus forming a two-dimensional data image in color.

13 Claims, 3 Drawing Figures

COLOR IMAGE DATA RECORDER

BACKGROUND OF INVENTION

1. Field of Invention

This invention relates to the field of pictorial data recording.

2. Description of Prior Art

The problem solved by this invention is that of devising a means for recording essentially three- or four-dimensional data as a two-dimensional pictorial recording in true or false color.

An example of three-dimensional data which may be so recorded is earth survey data representing surface temperature at each point in a region of the earth's surface, the two spatial dimensions, together with the value assigned to each point providing the three-dimensional nature of the data. Other examples of three-dimensional data are the total intensity of light reflected from each point in a region, the magnetic field intensity at each point in a region, and the like.

An example of what is essentially a four-dimensional data matrix is the observed color of visible light reflected from each point in a region of the earth's surface. Here two dimensions of the data matrix are provided by the two spatial dimensions of the region being surveyed, the third (spectral) dimension is provided by the total spectral bandwidth of the sensor or other data acquisition means; and the fourth dimension is provided by the observed intensity of light within each of the incremental component bands of this spectrum. In effect, therefore, an ordinary color photograph is a recording of four-dimensional data of this sort.

The problem exists, however, in making a continuous two-dimensional true- or false-color hard-copy recording corresponding to three and, particularly, four-dimensional data as it is acquired (i.e., in real time) or from data which has previously been recorded by ordinary electronic means, such as a tape recorder.

We will assume, for discussion purposes, that in our four-dimensional example, data is acquired through a satellite sensor line scan of the earth's surface. Here, one of the dimensions is the direction of the satellite motion, which can be thought of as spatial (although it is really temporal). The second dimension is the spatial dimension transverse to that of the satellite motion, representing position along a particular scan line. The third dimension is the spectral range (e.g., visible light, gamma radiation, near-or far-infrared, etc.) of the sensor which is acquiring the optical data. Finally, the fourth dimension is the observed intensity within each incremental spectral band.

Ordinarily such data is recorded on a multi-channel tape recorder. The instantaneous amplitude of the signal in each channel represents either the instantaneous amplitude or intensity of the light observed within a corresponding spectral band.

Several means have heretofore been employed in producing true- or false-color recordings of this type of data.

One such means is to acquire or convert the spectral data into three channels of information corresponding, respectively, to the intensities of the red, blue and green components of the light. The entire data matrix (or a large spatial portion of it) is displayed as a single, two-dimensional image on a color TV screen and color photographed.

The problem with this method is that resolution is limited by the 525-line limit of the ordinary color TV screen. If more than 525 scan lines are included in the data matrix, a continuous photographic recording cannot be made, except by developing the final print as a series of 525-line frames placed end to end.

Another method is similar to the last, except that a black-and-white CRT is employed. As in the color TV case, data from a single one of the three channels is displayed on the screen. The image is passed through a filter whose color corresponds to the spectral band of the particular data channel, and the filtered image is photographed on color film. This is repeated for the other two channels. The resulting photograph consists of the three images superimposed. This method presents all the inherent difficulties of the aforementioned color TV method, and introduces, in addition, the problem of precise registration of the three superimposed images.

All such systems are also deficient in that they provide little flexibility in altering the scan rate, in the density of data produced on the final photograph, and in their false-color capability.

SUMMARY OF INVENTION

Accordingly, it is an object of the invention to provide an improved apparatus and method for producing continuous, two-dimensional, true- or false-color pictorial data recordings.

In the present invention, data frames are successively displayed on a black-and-white CRT screen. In a given data frame the horizontal displacement corresponds to the horizontal position of the particular datum in the data matrix. The value assigned to the datum is represented by the contents of a "narrow" vertical "slice" through that horizontal displacement position. The vertical position of any point on the screen corresponds to a particular point in the visible spectrum. For example, the top of the screen might correspond to violet while the bottom of the screen corresponds to red, the intervening portion representing a continuous transition, spectrally, from violet to red.

The light from the CRT screen is collimated, and the resultant beams are directed to a spectral dispersion element, such as a transmission or reflection grating or prism. Each horizontal line (or dot) on the screen will result in the generation of a number of vertically-displaced horizontal colored lines (or dots). Assuming that something approaching "pure" white light is generated by the CRT screen, this series of lines (or dots) approaches a continuum whose hue varies from at least violet at one end to at least red at the other.

The light from the dispersion element is imaged onto a plane containing a slit which is parallel to the horizontal dimension of the CRT screen. By properly selecting and adjusting the focal lengths and mutual placement of the various elements in the system, including, particularly, the vertical position of the slit, the blue portion of the spectrum generated by the dispersion element in the correspondence to a line (or dot) on the CRT screen in the "blue" vertical position, is imaged onto the slit. Likewise, the red portion of any resulting beam, which beam corresponds to the "red" vertical position in the screen is so imaged, as is the green portion of the beam corresponding to the "green" position, and so on.

Thus, elemental hue is represented as vertical position on the black-and-white CRT screen, and this positional information is converted into light on the actual hue imaged onto the slit. In addition, if there are several lines on the screen, they will result in a color line which is a super-position and optical combination of the elemental hues represented by their respective vertical positions.

False-color can be produced, if desired, by vertical re-positioning of the slit, and by other means discussed below.

The resulting color line is recorded on a light sensitive medium such as color photographic film, which may be placed in close contact with the slit. The film is moved (or relative motion between the film and the slit is otherwise accomplished) in correspondence to the continuing succession of data frames presented on the screen, to produce a continuous two-dimensional color recording.

DETAILED DESCRIPTION OF THE PREFERRED EMBODIMENT

The initial element in the apparatus of the preferred embodiment of the present invention is a conventional cathode ray tube (CRT) 10. Since it is preferable that the light projected by the screen 15 of the tube be as nearly white as possible, it is preferred that P-22 phosphor be employed.

A projection TV-type tube with an aluminized screen can be used in substitution for the CRT 10. In such a device, an aluminized screen is selectively bombarded by an internal electron beam causing the struck regions to glow with white light. While such a device may be more reliable in producing the desired black-and-white pattern, it has been found that an ordinary P-22 phosphor CRT yields satisfactory results and is less expensive and easier to obtain.

The electron beam of the CRT is deflected in a conventional manner by means of a magnetic coil or electrostatic plates operated by X (horizontal) sweep and Y (vertical) deflection signals. The X-sweep is controlled by a conventional timing signal, which may comprise a saw-tooth signal, as employed in connection with the X-sweep of an ordinary TV picture tube. As specified below, the Y-deflection may be controlled by various means, including a step-function signal or the data signal itself, the particular means depending on the particular type of data and the type of recording desired. The beam intensity will either be uniform or controlled by the data signal, again depending on the particular application, as specified below.

Figure 1:
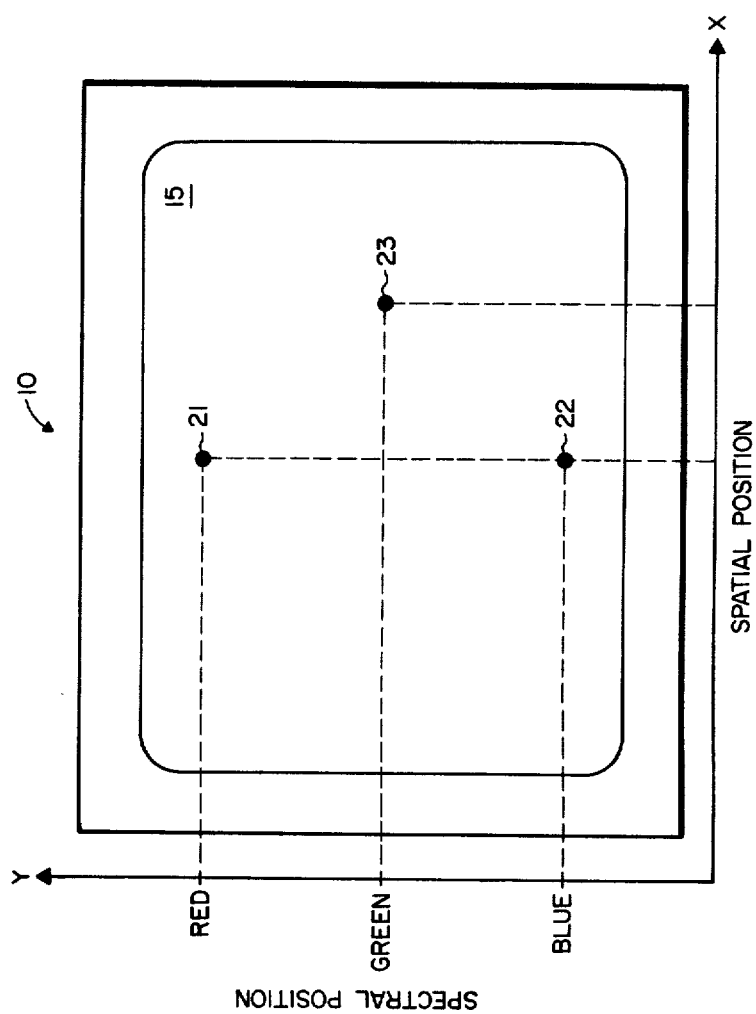
FIG. 1 is a schematic representation of a black-and-white CRT screen, showing dimensional and definitional characteristics of the system.

Referring now to FIG. 1, there are shown three illuminated phosphor dots, 21, 22, 23 on the screen 15 of the CRT 10. Two of the dots 21, 22 are in an identical X-displacement position, and the other dot 23 is horizontally displaced from them.

The entire data frame on the screen represents a single line of original data, in a data matrix of two spatial dimensions. One of these two dimensions is represented by the X-coordinate on the screen, and the other is represented by the position of the particular data frame instantaneously projected on the screen within the entire sequence of data frames.

The third dimension is spectral and is represented by vertical position on the screen. Thus, if the data frame on the screen shown in FIG. 1 is the 500th in a 1000-frame series, dots 21 and 22 would represent two spectral values assigned to a spatial point in the approximate center of the two-dimensional data region.

Since the Y-deflection on the screen represents the spectral position of a particular datum, it can be seen that dot 22, although it actually generates white light, represents blue, while dot 21 represents red. Since these two points represent the same spatial point in the data region, the information portrayed by them represents the fact that the particular spatial point in the data region is assigned some mixture of red and blue, the exact combination depending on the relative intensities of the two color components (and dots on the screen).

It will be seen below, in the course of the discussion of the various types of data which may be recorded by this apparatus, that the blue and red color components assigned to the particular spatial point in the data region may merely represent an arbitrary assignment of color to some other measured quantity.

The object of the apparatus is to image, on the slit 70, a dot of colored light, horizontally displaced along the slit in the same relative manner as the horizontal displacement of dots 21 and 22, which color dot is, in fact, a combination of red and blue light of the same relative intensities as these two illuminated phosphor dots themselves. This is accomplished as follows.

The white light radiating from dot 22 on the CRT screen 15 is collimated into a parallel beam A, by a collimating lens 25.

Beam A is spectrally dispersed by a transmission defraction grating 30 to form a number of mutually angularly displaced beams of varying color across the spectrum generated by the grating. Where the CRT screen produces essentially pure white light (as where P-22 phosphor is employed), this plurality of angular displaced beams will approach a continuum of beams varying continuously along the visible spectrum.

Figure 2:
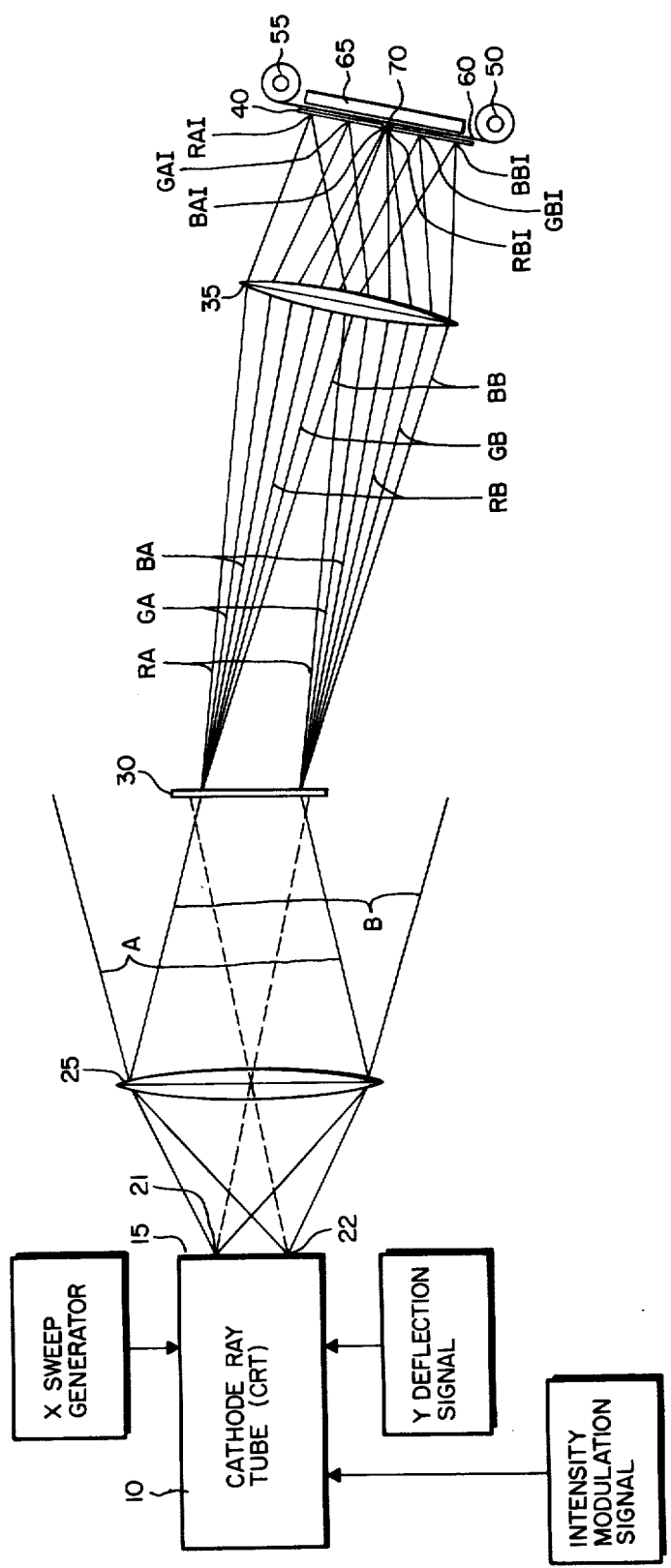
FIG. 2 is a schematic side elevation view of the apparatus of the principal embodiment of the present invention.

The transmission grating 30 may be selected so as to suppress all but the first order defraction pattern, which is the one shown in FIG. 2 and which offers real advantages. Such a selected transmission grating can be readily purchased off-the-shelf. Alternatively, the angular placement of the succeeding elements in the apparatus may be adjusted so that none but the first order pattern is imaged. This obviates the need for a selective grating.

For convenience in subsequent discussion, we will select from the large number (or continuum) of colored beams resulting from the spectral decomposition of beam A, a red beam, a blue beam and a green beam. In FIG. 2 the red beam resulting from the decomposition of beam A as designated RA, while the green beam is shown as GA, and the blue beam is shown as BA.

The beams are imaged by an imaging lens 35 onto a focal plane 40 containing a slit 70. The focal plane is fabricated so that it is readily adjustable in a vertical direction — i.e., along the dimension shown in side elevation in FIG. 2. The particular mechanical means necessary to accomplish this are entirely conventional and may involve merely an ordinary rack and pinion adjustment with a set screw, or some other means well known in the optical art.

The slit 70 is preferably rather narrow, since its width will determine spectral, and to a large extent spatial resolution of the final pictorial recording. The slit width can be made adjustable if desired, by employing an ordinary aperture adjustment means which may involve the use of a rack and pinion device with a set screw, or some other conventional means.

The proper linear dimension (i.e., length) of the slit will depend on the focal length and mutual placement of the various optical elements in the apparatus. The relationship between the minimum slit length and the horizontal dimension of the line(s) on the CRT screen 15 is given by:

$$F_i/F_c = I/O$$

where
$F_i$ = the focal length of the imaging lens 35,
$F_c$ = the focal length of the collimating lens 25,
$I$ = the image size (here, the minimum length of the slit) and
$O$ = the object size (here, the maximum horizontal dimension of the CRT trace).

It will soon be obvious that it is most convenient if the optics can be selected so that the slit length is less than 35 mm.

Behind the focal plane 40 is a color-responsive photo-sensitive medium. In the preferred embodiment of the invention this medium is ordinary 35 mm color motion picture or still film. It may also comprise a photo-sensitive plate or any other color-responsive light recording medium.

In embodiments in which motion picture or still film is employed, the film 60 is fed from a feed spool 50 and collected by a takeup spool 55. A backing plate 65 insures that the film will be held in direct contact with the focal plane 40 so that the colored light will be properly imaged on the film as well as the slit.

What is imaged onto the film is a color image of what appears on the CRT screen. Returning to our analysis of the light resulting from point 22 on the CRT screen and the three beams from the spectral dispersion element 30, which we have selected for discussion — RA, GA and BA — we see that the image on the focal plane 40 is a red image of dot 21, designated RAI, green image of dot 23, GAI, and a blue image of dot 22, BAI. The vertical position of the slit 70 is selected so that what is imaged on the slit (and the film) is the blue image, BAI, since dot 22 represents blue.

Thus, by properly selecting the focal length of collimating lens 25 and of the imaging lens 35 and the mutual placement of the various elements in the apparatus, an illuminated phosphor dot 22 on the black-and-white CRT screen 15, which dot is in a particular horizontal position, and whose vertical position represents blue, is imaged onto the color film 60 as a blue dot having the same relative horizontal position.

In an entirely similar manner, the point 21, in the same horizontal position, but whose vertical position represents red, is imaged in the identical position as a red dot.

Specifically, light from dot 21 is collimated into a beam B which is spectrally dispersed into a number of colored beams, including a red beam, RB, a green beam, GB, and a blue beam, BB. These are imaged on the focal plane 40 as, respectively, a red beam image, RBI, a green beam image, GBI, and a blue beam image, BBI. Of course, the other colored beams resulting from dot 21 are similarly imaged on the focal plane as are those from dot 22.

In particular, the red beam image from dot 21, RBI, is superimposed on the blue beam image from dot 22, BAI. I.e, the data projected on the black-and-white CRT screen 15, as a pair of phosphor dots representing, together, a combination of blue and red, is imaged onto the film 60 as a dot in an actual combination of blue and red light. Of course, the relative intensities of the red and blue images will be identical to the relative intensities of the two corresponding dots on the CRT screen which, in turn, are governed by the actual data displayed thereon in a manner to be subsequently discussed.

The blue image from point 22 and the red image from point 21 can be caused to coincide at the vertical position of the slit 70 only if the focal lengths and vertical positions of the elements of the apparatus are carefully selected and adjusted. However, this is simply the same elementary problem which is universally confronted and solved by ordinary optical technicians, particularly in the related spectroscopic art.

In like manner, dot 23 on the black-and-white CRT screen 15, whose horizontal position differs from that of dots 21 and 22, and whose vertical position represents green, is imaged onto the photographic film as a dot of green light in the proper relative horizontal position.

Thus, the entire data frame projected on the black-and-white CRT screen, which contains (horizontal) spatial information and (vertical) spectral information results in a colored line (in our example, two color dots) on the photographic film 60 containing the identical spatial and spectral information, but in color.

If desired, the aforementioned true color system can be slightly altered to produce false color. By simply moving the slit 70 upward or downward, the actual image recorded on the film 60 may be spectrally displaced in one spectral direction of the other. Referring to FIG. 2, if one wished to cause dot 22, which represents blue information, to be recorded on the photographic film 60 as a green dot, he would simply have to move the slit 70 upward to the position at which the green beam GA, resulting from dot 22, is imaged, as green dot GAI.

Other means for producing false color will be described below.

In any event, as the data frames are sequentially projected onto the CRT screen 15, which sequence represents changes in the second spatial dimension of the data matrix, the film 60 is moved relative to the slit 70. Of course, the relative speed of the film motion will determine the extent to which the data record is to be compressed or expanded on the film. Relatively slower movement of the film generates a relatively compressed data record on the film.

If a constant amount of data compression or expansion is desired, the linear speed of film motion must be correlated in a fixed relationship with the rate at which data frames are projected onto the CRT screen 15, ordinarily by appropriate adjustment of the revolution rate of the takeup spool 55 and, perhaps also, of the feed spool 50.

In particular, the input data signal to the CRT can be caused to control the movement of the film, most simply by placing a short pulse in the data sequence to indicate each frame change, the drive mechanism for the film responding to the pulse by incrementally moving the film. Such a control apparatus would merely involve the use of an electromechanical switch responsive to pulses of a given amplitude, which switch enables a stepper-motor drive.

More typically, the film 60 is made to undergo continuous linear motion at a fixed rate, which is properly adjusted so that the desired spacing of the colored lines on the film is produced. It will be observed that this procedure may result in the lines being slightly tilted, relative to the linear dimension of the film (because of finite amount of time is required to sweep the entire data frame onto the CRT screen 15, during which time the film will have moved). However, this is actually desirable in cases wherein the original data is acquired by satellite line scan, since the satellite is in constant relative linear motion during each scan. I.e., continuous film motion duplicates these data acquisition conditions.

The ultimate result of this procedure will be a record on the film 60 which consists of a two-dimensional true- or false-color recording of the original data.

Certain types of data which may be recorded by means of the apparatus, and the nature of the resulting color recordings will now be analyzed by means of four examples.

The first example is a situation wherein thre-dimensional data is to be recorded. In this example we will select, as two of our dimensions, the two spatial dimensions of a region on the earth's surface, while the third dimension will be the surface temperature at each point within the region. We will assume that the data is acquired by means of a satellite sensor line scan in which the satellite moves continuously along one (vertical) dimension while a transverse (horizontal) line scan occurs. We will assume that the desired end product of this endeavor is a two-dimensional color portrait of the surface temperature conditions in that region of the earth's surface wherein the vertical dimension of the region is represented by the linear direction of the movement of the film 60, while the horizontal scan direction is represented as transverse thereto (i.e., aligned with the slit 70). Finally, we will assume that the instrumentation is calibrated so that the highest temperature observed will be recorded on the ultimate data recording as red, while the lowest temperature is recorded as violet, with intermediate temperatures represented as intermediate hues within the visible spectrum.

In this example, it will be readily acknowledged by those skilled in the art of satellite sensor data acquisition that the resultant signal from the satellite sensor will typically comprise a continuous analog trace whose instantaneous amplitude relates in known manner to the instantaneous temperature observed. The signal elapsed time will relate in a known manner to the elapsed time in the actual scan of the region. Thus, the signal will begin with the temperature observed at the beginning of the first scan line at the bottom of the region, continue through that line, immediately continue with the beginning of the next line and so on until the entire region has been surveyed.

To record the data in the desired manner, the intensity of the electron gun of the CRT 10 is held constant. The X-sweep is operated by an ordinary saw-tooth wave whose repetition rate equals the amount of time in the data signal which represents a single line scan. The data signal, itself, operates the Y-deflection of the CRT, so that a relatively large amplitude in the signal will cause large deflection (i.e., activate a phosphor dot toward the top of the screen 15) while a relatively low amplitude will cause illumination of a phosphor dot near the bottom of the screen.

As the data signal is fed into the Y-deflection plates or coil, data frames (each representing a single line of the line scan) are sequentially swept across the screen. As explained above, result of each of these data frames will be a colored line on the photographic film 60 in which each resolution element displays a particular (true or false) color. This particular color corresponds to the vertical position of the corresponding phosphor dot on the screen 15. That vertical position corresponds, in turn, to the instantaneous temperature sensed at that point in the particular line of the line scan. The totality of colored lines constitutes the complete data record.

The second example is identical to the first, except in regard to the nature of the data record to be produced. Here, instead of representing the instantaneous value of the data as a particular hue, it will be represented as a particular intensity of a uniform hue. Thus, the data record will comprise a two-dimensional photograph in a single hue, arbitrarily chosen, in which the intensity of the color varies throughout, in accordance with the value of the measured quantity in each resolution element of the region.

This sort of record may be produced in exactly the same fashion as the type of record just discussed, except that here the data signal is caused to operate the intensity of the electron gun, rather than the Y-deflection. The Y-deflection is simply fixed at a particular level so that all data swept onto the screen 15 of the CRT 10 is at a fixed vertical position, selected according to the desired hue of the finished record. Thus, each data frame on the screen consists of a horizontal line of varying intensity.

The colored line imaged on the slit 70 and on the film 60 would likewise vary in intensity along its length. Since the vertical position of the line on the screen 15 is fixed, the hue of the recorded line would be uniform.

Our third example is related to the previous two. Here, however, the data is acquired in a different manner, and the resulting data signal reflects this difference.

In this example, we will assume that digital data representing the population density in each incremental region (i.e., resolution element) of the contiguous 48 United States has been obtained. We will further assume it is desired to record this data as a colored map of the United States in which the particular hue represents the population density (in the manner of our first example) or in which the intensity of the same hue used throughout represents the population density (in the manner of our second example).

Here, a digital signal is created, which signal logically duplicates a line scan of the map of the United States. Most conveniently it might be represented as a line scan from north to south, beginning in the westernmost portion of the map and continuing eastward. Obviously, outside the limits of the map there is zero population density, and the data signal would be appropriately "filled in" to indicate this fact.

Having thus defined the problem and the type of digital signal required, it would be a simple matter for one skilled in the data processing art to produce such a signal, and this signal would be used in the manner of either our example 1 or example 2 (depending on the type of color representation desired) to produce the desired colored map of the United States. In this example, since the data was not acquired by an actual line scan, the film 60 would have to be moved discontinuously (for example, by means of a stepper motor as described above) so that each line of the scan is as perpendicular as possible to the linear dimension of the film.

As our fourth and final example, we will consider the recording of four-dimensional data. For this example, we will assume that the data is acquired by satellite line scan as described above, wherein two of the dimensions are the aforementioned spatial dimensions. The problem will be to produce a colored spectral recording of the visible light reflected from each resolution element of the earth's surface in the particular region. It will be understood, of course, that the problem can be generalized to the infrared or other non-visible regions of the electromagnetic spectrum by assigning a particular visible color to each wavelength. The third dimension of the data is the spectral dimension, i.e., an increment in this dimension corresponds to an incremental spectral band within the observed spectrum. The fourth dimension is the observed intensity within the particular incremental spectral band.

We will assume that the data is acquired as a parallel multi-channel electronic signal, each channel representing one of the spectral bands, and the instantaneous amplitude within that channel representing the instantaneous observed intensity of light within that band. We will assume for the sake of convenience that only three channels (red, blue and green) are employed, although typically the sensor input will be spectrally decomposed into a larger number of bands.

The first step in producing the desired color data record is to serialize the multi-channel data. This is done quite simply by recording a secondary single-channel data signal representing, in series, the data representing the red intensity of the first line of the line scan, the first-line green channel signal, the first-line blue channel signal, the second-line red channel signal, the second-line green channel signal, etc.

To reproduce this data, the data signal itself is caused to govern the intensity of the electron gun of the CRT 10. The X-sweep is again governed by a saw-tooth signal whose repetition period equals the elapsed time within each line of the scan. Since the data which operates the CRT is a serialization of three-channel data, the Y-deflection is governed by a step function signal. The length of each step conforms to the repetition period of the saw-tooth signal, and the amplitude of each step is such that the data during the particular sweep will be displayed in the correct vertical position on the CRT screen 15. For example, the amplitude of a step in the Y-deflection function which will be in effect when red-channel data is being displayed on the screen is chosen so as to cause that line of illuminated phosphor to be in the "red" vertical position on the screen.

The data frame in this example consists, therefore, of three horizontal lines each in an appropriate vertical position on the CRT screen 15 to represent respectively red, blue and green. The "red" line will record on the film 60 as an actual red line whose incremental intensity along the line represents the instantaneous amplitude of the original data signal (which represents the intensity of observed light within the red spectral band during that line of the line scan). The blue and green lines will record similarly. The rapidity of the three horizontal scans of the data frame will insure that the three colored lines will properly superimpose on the film to reproduce, in color, the actual sensor data acquired during the corresponding line scan of the earth. The entire sequence of line scans will produce, on the film, the desired two-dimensional color portrait of the particular region of the earth's surface.

If false color is desired, it may be produced in at least two ways. The first method is the aforementioned slit position adjustment, whereby the slit 70 is purposely moved from its "true" color position, so that the color actually imaged onto the slit is not the same as that represented by the corresponding vertical position on the screen 15.

A second method is to adjust the Y-deflection, itself, so that a given phosphor dot is purposely displaced from the position on the screen 15 which would normally represent the color of the spectral band within which that datum was originally acquired. Referring to FIG. 1, blue data could be recorded as green on the film if dot 22 (or the entire line of data which incorporates it) were purposely deflected upward to the vertical position of dot 23.

Similarly, to accentuate visual differences between colors which are spectrally close, such as yellow and orange, the Y-deflection signal can be adjusted so that the mutual vertical spacing of the data lines (recalling that in many applications there will be far more than merely red, blue and green) can be increased.

In this regard, it should be pointed out that great flexibility exists in the actual electron beam deflection employed.

For illustrative purposes, the drawing shows the entire screen 15 being employed for Y-deflection and X-sweep. In most cases, however, this will not be true, because utilization of the entire screen would require the use of lenses and a spectral dispersion element which are impractically large. Thus, if the extreme Y-deflection and X-sweep are adjusted so that only a small portion of the screen is involved, what is lost in terms of resolution will usually be more than compensated for in terms of the more economical and often superior optical performance of the smaller optical elements whose use in thus permitted.

Many other modifications in the basic apparatus described above are possible.

For example, the plane transmission grating 30, which is utilized as the spectral dispersion element in the preferred embodiment of the invention, can be replaced by a reflection grating, prism 31 (see FIG. 3) or any other spectral dispersion element.

Figure 3:
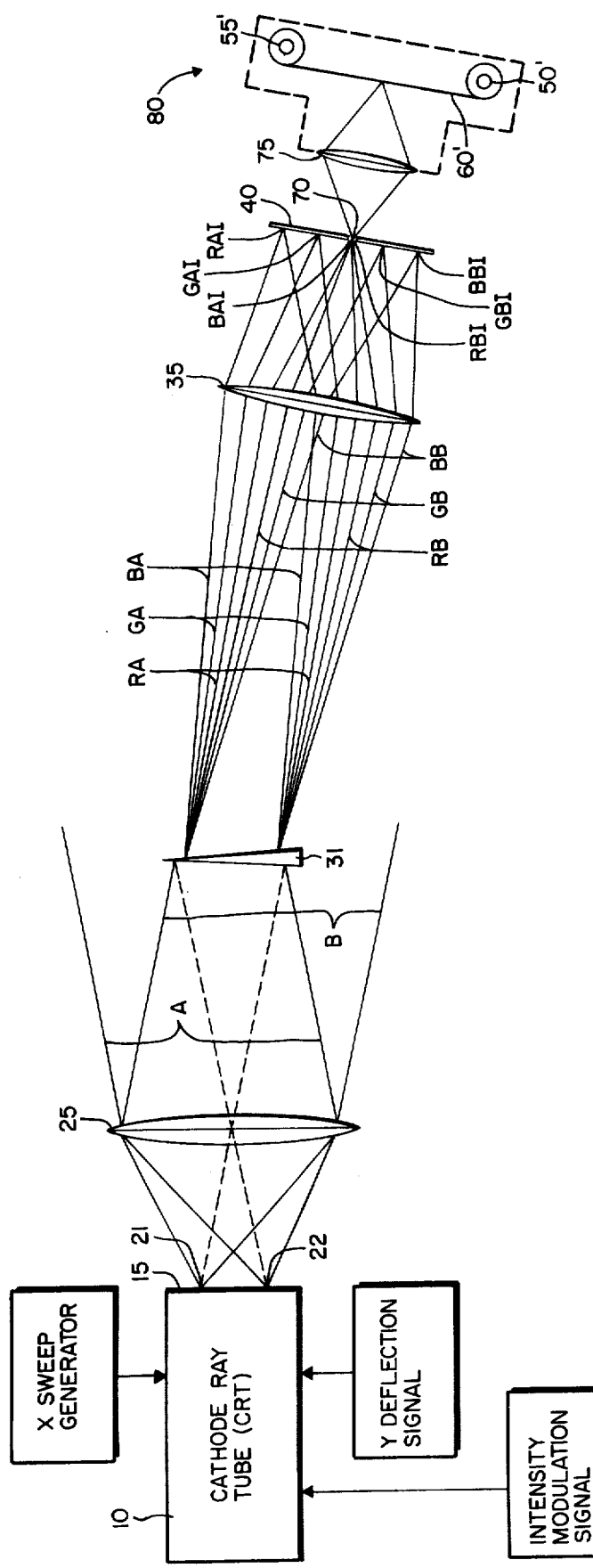
FIG. 3 is a schematic side elevation view of the apparatus of an alternative embodiment of the present invention.

Likewise, as shown in FIG. 3, the final image to be recorded can be reimaged from the slit 70 by means of an additional optical element 75, onto a film 60' which is displaced from the slit itself. This alternative embodiment suggests the use of an ordinary motion picture or still camera 80 as the image recording means.

In an embodiment which is not illustrated, relative motion between the slit 70 and the film 60 may be created by means of a scanning mirror, rather than by actual physical motion of the film.

I claim:

1. The method of producing hard-copy color recordings representative of multi-dimensional data contained in an electrical signal, one of the dimensions of the data being represented spectrally, and at least one of the other dimensions being represented spatially, comprising the steps of:

displaying, on electronic light emitting means responsive to said electrical signal, a two-dimensional primary pattern of substantially white light units, the first dimension of said primary pattern representing the spatial dimension of at least a portion of said data, and the second dimension of said primary pattern representing the spectral dimension of said portion;

spectrally decomposing the white light from said primary pattern into a secondary pattern of colored light, the chromatic content of said secondary pattern being primarily determined by the positions of said white light units in said second dimension;

generating, from said secondary pattern, a colored line representing the spatial and spectral data represented by at least part of said primary pattern; and recording, on color-responsive photosensitive means, a color image recording of said colored line.

2. The apparatus for producing hard-copy color recordings representative of multi-dimensional data contained in an electrical signal, one of the dimensions of the data being represented spectrally, and at least one of the other dimensions being represented spatially, comprising:

electronic light emitting means responsive to said electrical signal for displaying a two-dimensional primary pattern of substantially white light units, the first dimension of said primary pattern representing the spatial dimension of at least a portion of said data, and the second dimension of said primary pattern representing the spectral dimension of said portion;

means for spectral decomposition of the white light from said primary pattern into a secondary pattern of colored light, the chromatic content of said secondary pattern being primarily determined by the positions of said white light units in said second dimension;

means for generating a colored line representing the spatial and spectral data represented by at least part of said primary pattern; and color-responsive photosensitive means responsive to said colored line for producing a color image recording thereof.

3. The apparatus as recited in claim 2, wherein said spectral decomposition means comprises a transmission grating.

4. The apparatus as recited in claim 2, wherein said spectral decomposition means comprises a prism.

5. The apparatus as recited in claim 2, wherein the hue of each incremental portion of said line corresponds in fixed relationship to the spectral value displayed within a corresponding increment in the first dimension of said primary pattern.

6. The apparatus as recited in claim 5, wherein the hue of each incremental portion of said line is substantially identical to the spectral value of a corresponding increment in the spatial dimension of the data represented by said primary pattern.

7. The apparatus as recited in claim 2, wherein said light emitting means comprises a cathode ray tube.

8. The apparatus as recited in claim 2, wherein said photosensitive means comprises color photographic film.

9. The apparatus as recited in claim 8, wherein said colored line generating means comprises an opaque member intervening between said spectral decomposition means and said photosensitive means, said opaque member containing an elongated, light-transmissive slit; and further including first optical imaging means intervening between said spectral decomposition means and said opaque member, said opaque member positioned at the focus of said first optical imaging means, said first optical imaging means adapted to selectively image at least a portion of said secondary pattern onto said slit.

10. The apparatus as recited in claim 9, wherein said color film is in close proximity to said opaque member.

11. The apparatus as recited in claim 10, further including means to move said film in a direction normal to the linear dimension of said slit.

12. The apparatus as recited in claim 9, wherein said color film is remote from said focal plane, and further including second optical imaging means to re-image, onto said film the image of said portion of said secondary pattern on said slit.

13. The apparatus as recited in claim 12, further including means to move said film in a direction normal to the linear dimension of said slit.

* * * * *